(12) United States Patent
Koo et al.

(10) Patent No.: US 9,293,181 B2
(45) Date of Patent: Mar. 22, 2016

(54) BLOCK SELECTION CIRCUIT AND SEMICONDUCTOR DEVICE HAVING THE SAME

(71) Applicant: SK hynix Inc., Gyeonggi-do (KR)

(72) Inventors: Bon Kwang Koo, Gyeonggi-do (KR); Won Beom Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 232 days.

(21) Appl. No.: 14/029,549

(22) Filed: Sep. 17, 2013

(65) Prior Publication Data
US 2014/0347949 A1 Nov. 27, 2014

(30) Foreign Application Priority Data

May 27, 2013 (KR) .......................... 10-2013-0059712

(51) Int. Cl.
| | |
|---|---|
| *G11C 8/12* | (2006.01) |
| *G11C 8/08* | (2006.01) |
| *G11C 16/06* | (2006.01) |
| *G11C 16/08* | (2006.01) |
| *G11C 16/04* | (2006.01) |

(52) U.S. Cl.
CPC .. *G11C 8/12* (2013.01); *G11C 8/08* (2013.01); *G11C 16/0483* (2013.01); *G11C 16/06* (2013.01); *G11C 16/08* (2013.01)

(58) Field of Classification Search
CPC ............ G11C 8/12; G11C 8/08; G11C 16/06; G11C 16/0483; G11C 16/08
See application file for complete search history.

(56) References Cited

U.S. PATENT DOCUMENTS

| | | | | |
|---|---|---|---|---|
| 2001/0054737 | A1* | 12/2001 | Nakamura et al. ............ | 257/315 |
| 2003/0043686 | A1* | 3/2003 | Lee et al. ...................... | 365/244 |
| 2009/0196103 | A1* | 8/2009 | Kim .......................... | 365/185.12 |
| 2009/0244975 | A1* | 10/2009 | Kang ........................ | 365/185.11 |
| 2010/0271881 | A1* | 10/2010 | Makino .................... | 365/185.18 |
| 2010/0284224 | A1* | 11/2010 | Wang ........................ | 365/185.11 |
| 2014/0043929 | A1* | 2/2014 | Jang .......................... | 365/230.04 |

FOREIGN PATENT DOCUMENTS

| | | |
|---|---|---|
| KR | 100965066 | 6/2010 |
| KR | 1020140020153 | 2/2014 |

* cited by examiner

*Primary Examiner* — J. H. Hur
(74) *Attorney, Agent, or Firm* — IP & T Group LLP

(57) ABSTRACT

A block selection circuit and a semiconductor device having the same may include a row decoder which includes a high voltage generating circuit configured to output a block selection voltage in response to upper addresses, switching circuits configured to receive the block selection voltage and a precharge high voltage, and forward the block selection voltage through one of the switching circuits that is selected in response to selection signals, and pass transistor groups configured to select a memory block in response to the forwarded block selection voltage.

19 Claims, 7 Drawing Sheets

BLOCK SELECTION CIRCUIT AND SEMICONDUCTOR DEVICE HAVING THE SAME

CROSS-REFERENCE TO RELATED APPLICATION

The present application claims priority to Korean patent application number 10-2013-0059712 filed on May 27, 2013, in the Korean Intellectual Property Office, the entire disclosure of which is incorporated by reference herein.

BACKGROUND

1. Technical Field

Various embodiments relate generally to an electronic device.

2. Related Art

A semiconductor includes a cell array storing data and a plurality of circuits configured to perform program, erase and read operations. Since the cell array includes a plurality of memory blocks, it is required to select one of the memory blocks for the program, erase or read operations with respect to the selected memory block. For this purpose, a semiconductor device includes a row decoder configured to select a memory block according to an address.

FIG. 1 is a block diagram illustrating a conventional semiconductor device.

Referring to FIG. 1, the semiconductor device includes the cell array including first to nth memory blocks and the row decoder configured to select one of the memory blocks according to row addresses XA, XB, XC and XD.

The row decoder includes first to nth high voltage generating circuits and first to nth pass transistor groups. The numbers of the high voltage generating circuits, the pass transistor groups and the memory blocks are the same as one another. For example, when the 4-byte row addresses XA, XB, XC and XD are input to each of the high voltage generating circuits, one of the high voltage generating circuits generates corresponding one of high voltage block selection voltages BLK1 to BLKn according to the row addresses XA, XB, XC and XD. A case where each address is 8 bits will be described as an example. Namely, XA is XA<8:1>, XB is XB<8:1>, XC is XC<8:1> and XD is XD<8:1>.

For an address of a memory block, one bit of the respective row addresses XA<8:1>, XB<8:1>, XC<8:1> and XD<8:1> becomes logic high, and the remaining seven bits of the respective row addresses become logic low. A memory block corresponding to the respective row addresses XA, XB, XC and XD, all of which have a logic high bit, is selected.

Each of the pass transistor groups includes a plurality of high voltage pass transistors coupled in common to global word lines GWL. The high voltage pass transistors included in each of the first to nth pass transistor groups are turned on by the block selection voltages and transmit the voltages from the global word lines GWL to local word lines LWL1 to LWLn.

For example, if the row addresses XA, KB, XC and XD input to the first high voltage generating circuit is '1111', the first high voltage generating circuit generates the first high voltage block selection voltage BLK1. Since the row addresses input to the remaining high voltage generating circuits include at least one '0' value, output nodes of the remaining high voltage generating circuits are either floated or discharged.

Meanwhile, since the conventional semiconductor device needs to include the voltage generating circuit and the pass transistor group for each of the memory blocks, there is a limit to downsize the semiconductor device. Particularly, the high voltage generating circuit, which includes a NAND gate configured to decode the row addresses and a plurality of switching devices, occupies a large area in the row decoder, and is one of serious factors of the limitation in downsizing.

BRIEF SUMMARY

Various embodiments relate to a block selection circuit capable of reducing a size of a semiconductor device and the semiconductor device having the same.

In an embodiment, a block selection circuit may include a row decoder configured to select a memory block in response to upper addresses included in row addresses, a level shifter configured to output a precharge high voltage by increasing an input voltage in response to a precharge signal, and a selection signal generator configured to generate selection signals in response to lowest addresses included in the row addresses and the precharge high voltage. The row decoder may include a high voltage generating circuit configured to output a block selection voltage in response to the upper addresses, switching circuits configured to receive the block selection voltage and the precharge high voltage and forward the block selection voltage through one of the switching circuits that is selected in response to the selection signals, and pass transistor groups configured to select the memory block in response to the forwarded block selection voltage.

In an embodiment, a block selection circuit may include a row decoder configured to select a memory block in response to upper addresses included in row addresses, and a selection signal generator configured to generate selection signals in response to lowest addresses included in the row addresses. The row decoder may include a high voltage generating circuit configured to output a block selection voltage in response to the upper addresses, switching circuits configured to receive the block selection voltage and forward the block selection voltage through one of the switching circuits that is selected in response to the selection signals, and pass transistor groups configured to select the memory block in response to the forwarded block selection voltage.

In an embodiment, a semiconductor device may include a plurality of memory blocks, a voltage generating circuit configured to output operating voltages to global word lines response to an operating signal, and a block selection circuit configured to select one of the memory blocks in response to row addresses, selectively coupling a plurality of groups of local word lines, each of which corresponds to a memory block to be selected, and the global word lines and for transmitting the operating voltages to one of the groups of local word lines selectively coupled to the global word lines. The block selection circuit may include a high voltage generating circuit configured to generate a block selection voltage in response to the row addresses, a plurality of switching circuits configured to forward the block selection voltage through one of the switching circuits corresponding to the memory block to be selected in response to selection signals that are generated in response to the lowest addresses among the row addresses and pass transistor groups configured to couple the global word lines and one of the groups of local word lines coupled to the memory blocks to be selected, in response to the forwarded block selection voltage.

DETAILED DESCRIPTION

Figure 1:
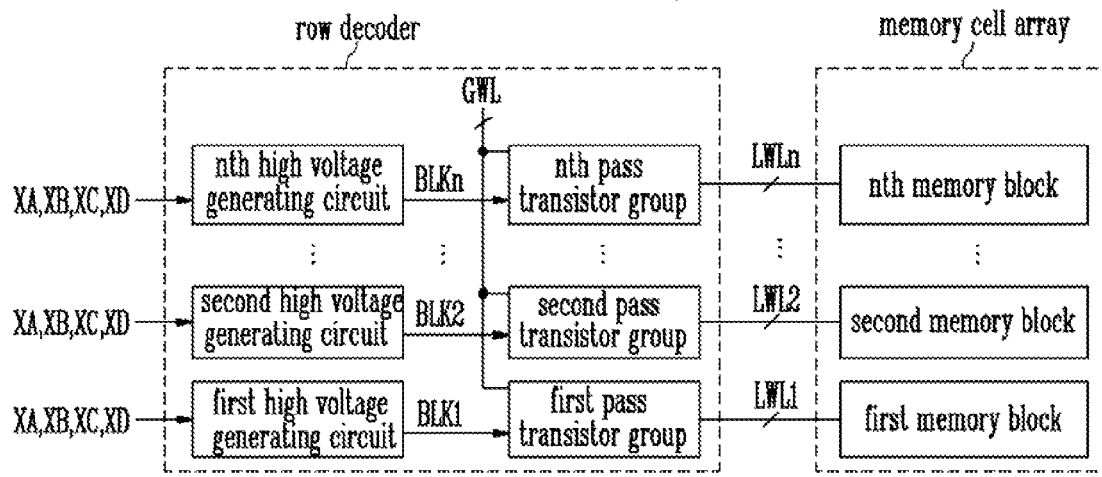
FIG. 1 is a block diagram illustrating a conventional semiconductor device.

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
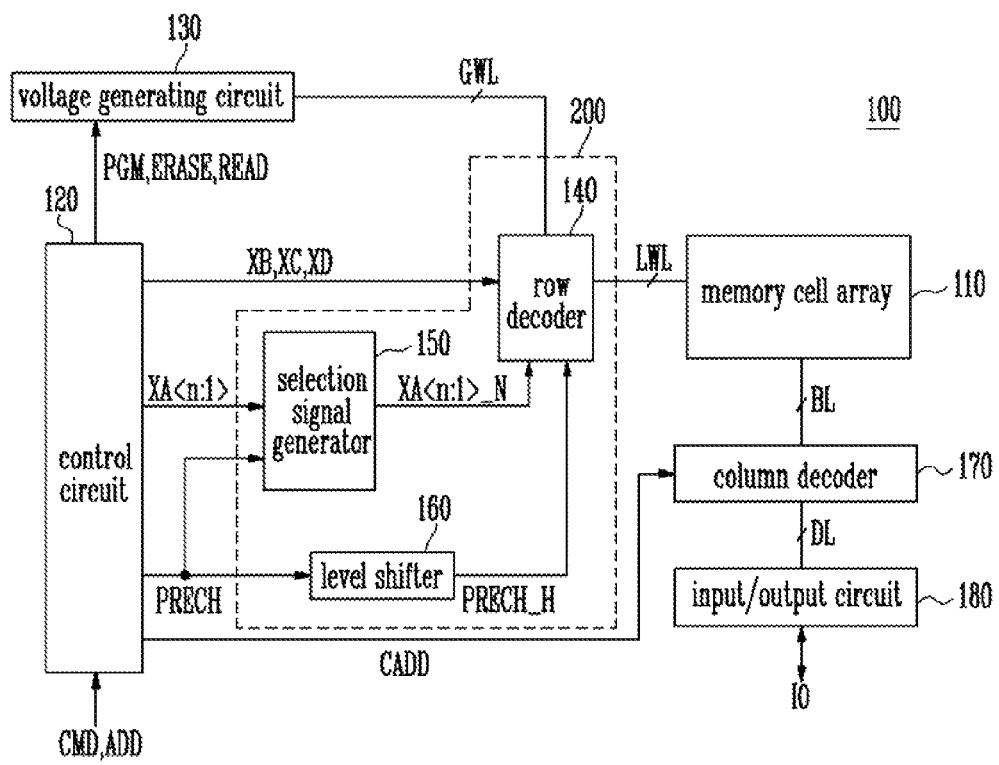
FIG. 2 is a block diagram illustrating a semiconductor device according to an embodiment of the present invention.

FIG. 2 is a block diagram illustrating a semiconductor device according to an embodiment of the present invention.

Referring to FIG. 2, a semiconductor device 100 may include a cell array 110 that may store data and peripheral circuits 120, 130, 200, 170 and 180 that may program data to the cell array 110 and read or erase the stored data.

The cell array 110 may include a plurality of memory blocks having a plurality of memory cells. The plurality of memory blocks are coupled to a plurality of local word lines, respectively.

The peripheral circuits may include a control circuit 120, a voltage generating circuit 130, a block selection circuit 200, a column decoder 170 and an input/output circuit 180.

The control circuit 120 may control the voltage generating circuit 130, the block selection circuit 200, the column decoder 170 and the input/output circuit 180 by outputting various signals according to a command signal CMD and an address ADD input from an outside. The control circuit 120 may output an operating signal PGM, ERASE or READ, precharge signal PRECH and a column address CADD as various signals and output row addresses XA<n:1>, XB<n:1>, XC<n:1> and XD<n:1> by decoding an input address ADD.

The voltage generating circuit 130 may generate a voltage necessary for each operation and output the voltage to global word lines GWL in response to the operating signal PGM, ERASE or READ output from the control circuit 120.

The block selection circuit 200 may couple local word lines LWL corresponding to a selected memory block in the cell array 110 and global word lines GWL in response to the row addresses A<n:1>, XB<n:1>, XC<n:1> and XD<n:1> and the precharge signal PRECH. For this purpose, the block selection circuit 200 may include a row decoder 140, a selection signal generator 150 and a level shifter 160. The level shifter 160 may be omitted depending on a configuration of the row decoder 140. The row decoder 140, the selection signal generator 150 and the level shifter 160 will be described later.

The column decoder 170 may select bit lines BL coupled to the cell array 110 according to a column address CADD output from the control circuit 120.

The input/output circuit 180 may output transmit data IO input from an outside to a column decoder 170 through data lines DL and output the data received from the column decoder 170 to the outside.

The block selection circuit 200 among the peripheral circuits will be described below.

Figure 3:
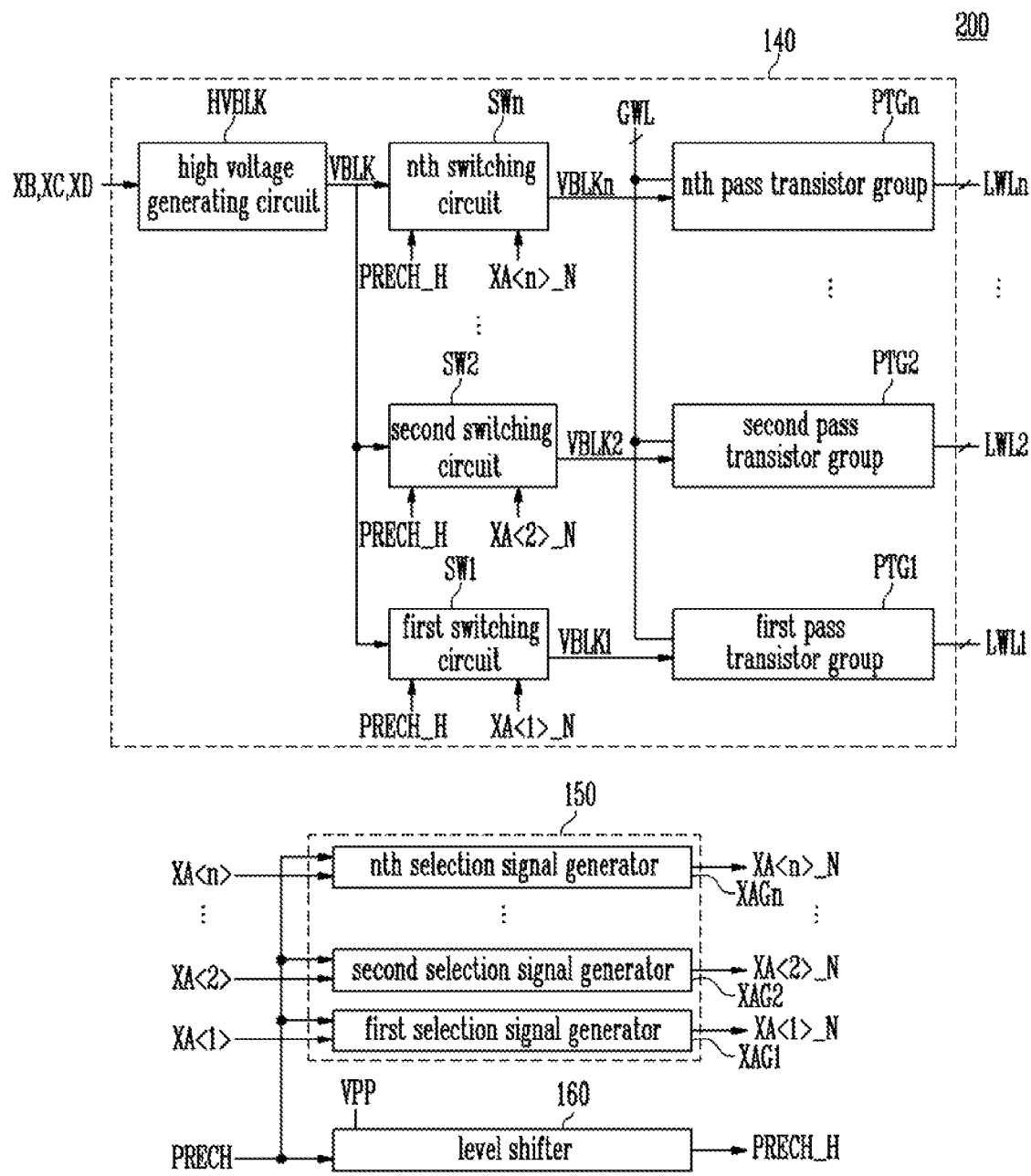
FIG. 3 is a block diagram illustrating in detail a block selection circuit shown in FIG. 2.

FIG. 3 is a block diagram illustrating in detail a block selection circuit shown in FIG. 2.

Referring to FIG. 3, the row decoder 140 may include a high voltage generating circuit HVBLK, a plurality of switching circuits SW1 to SWn and a plurality of pass transistor groups PTG1 to PTGn.

The high voltage generating circuit HVBLK may output the block selection voltage VBLK in response to upper addresses except for lowest addresses among the row addresses output from the control circuit 120, for example, a first upper address XD<n:1>, a second upper address XC<n:1> and a third upper address XB<n:1> except for lowest addresses XA<n:1> among the row addresses XA<n:1>, XB<n:1>, XC<n:1> and XD<n:1>. The upper address and the lowest addresses will be described below.

The first to nth switching circuits SW1 to SWn receive the block selection voltage VBLK and the precharge high voltage PRECH_H in common and output first to nth block selection voltages VBLK1 to VBLKn in response to first to nth selection signals XA<1>_N to XA<n>_N, respectively.

The first to nth pass transistor groups PTG1 to PTGn transmit a voltage applied to the global word lines GWL to a first to an nth local word lines LWL1 to LWLn in response to the first to nth block selection voltages VBLK1 to VBLKn. The precharge high voltage PRECH_H and the first to nth selection signals XA<1>_N to XA<n>_N will be described below.

One of the first to nth selection signals XA<1>_N to XA<n>_N input to the first to nth switching circuits SW1 to SWn may have a value of '0', and the remaining selection signals may have a value of '1'. Here, a signal having a value of '0' may mean a signal of logic low level, and a signal having a value of '1' may mean a signal of logic high level. For example, if the nth selection signal XA<n>_N may have a value of '0', and if the remaining first to n-1$^{st}$ selection signals XA<1>_N to XA<n-1>_N have a value of '1', only the nth switching circuit SWn outputs the high nth block selection voltage VBLKn and the remaining first to n-1th switching circuits SW1 to SWn-1 does not output first to n-1th block selection voltages VBLK1 to VBLKn-1. Here, output nodes of the first to n-1th switching circuits SW1 to SWn−1 that do not output the first to n−1th block selection voltages VBLK1 to VBLKn−1 may be discharged.

Accordingly, only the nth pass transistor group PTGn, which receives the high nth block selection voltage VBLKn among the first to nth pass transistor groups PTG1 to PTGn, may transmit a voltage applied to the global word lines GWL to the nth local word lines LWLn in response to the nth block selection voltage VBLKn. The remaining first to n−1th pass transistor groups PTG1 to PTGn−1 may not transmit a voltage applied to the global word lines GWL to the first to n−1th local word lines LWL1 to LWLn−1. That is, the nth memory block coupled to the nth local word lines LWLn is selected by the upper addresses XD<n:1>, XC<n:1> and XB<n:1> and the first to an nth selection signals XA<1>_N to XA<n>_N generated by the selection signal generator 150 in response to the lowest addresses A<n:1>, and the first to n−1th memory blocks are unselected.

The selection signal generator 150 may include first to nth selection signal generating circuits XAG1 to XAGn. The first to nth selection signal generating circuits XAG1 to XAGn receive the precharge signal PRECH in common and generate the first to nth selection signals XA<1>_N to XA<n>_N in response to the first to nth lowest addresses XA<1> to XA<n>.

One bit of the first to nth bits XA<1> to XA<n> of the lowest addresses XA<n:1> may be '1', and the remaining bits may be '0'. One of the first to nth selection signal generating circuits XAG1 to XAGn may generate the selection signal having a value of '0', and the remaining selection signal generating circuits may generate selection signals having a value of '1', among the first to an nth selection signals XA<1>_N to XA<n>_N.

The level shifter 160 may receive a high voltage VPP and generate the precharge high voltage PRECH_H in response to the precharge signal PRECH.

The row decoder 140, the selection signal generator 150 and the level shifter 160 will be described below.

Figure 4:
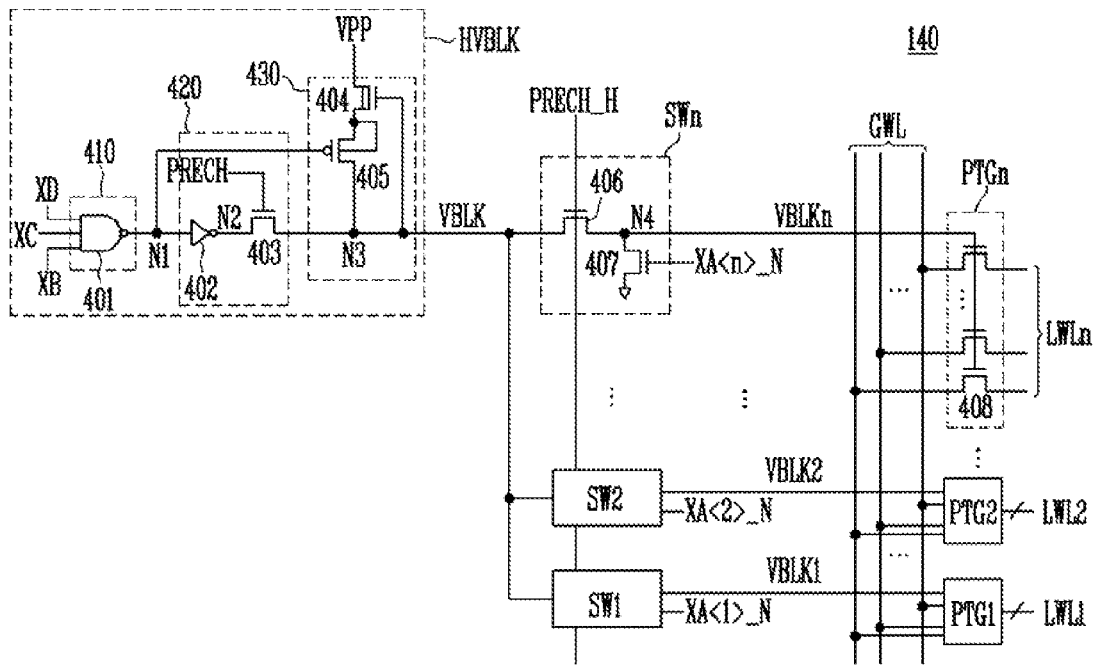
FIG. 4 is a circuit diagram illustrating in detail a row decoder shown in FIG. 3 according to an embodiment of the present invention.

FIG. 4 is a circuit diagram illustrating in detail the row decoder shown in FIG. 3 according to an embodiment of the present invention.

Referring to FIG. 4, the high voltage generating circuit HVBLK may include an address logic combination circuit 410, a reversing circuit 420 and a pull-up circuit 430.

The address logic combination circuit 410 may include a NAND gate 401 that may perform NAND operation to the upper addresses XB, XC and XD input to the row decoder 140 and may output the result of the NAND operation to a first node N1. The lowest addresses and the upper addresses of the row addresses will be described by referring to FIG. 8.

Figure 8:
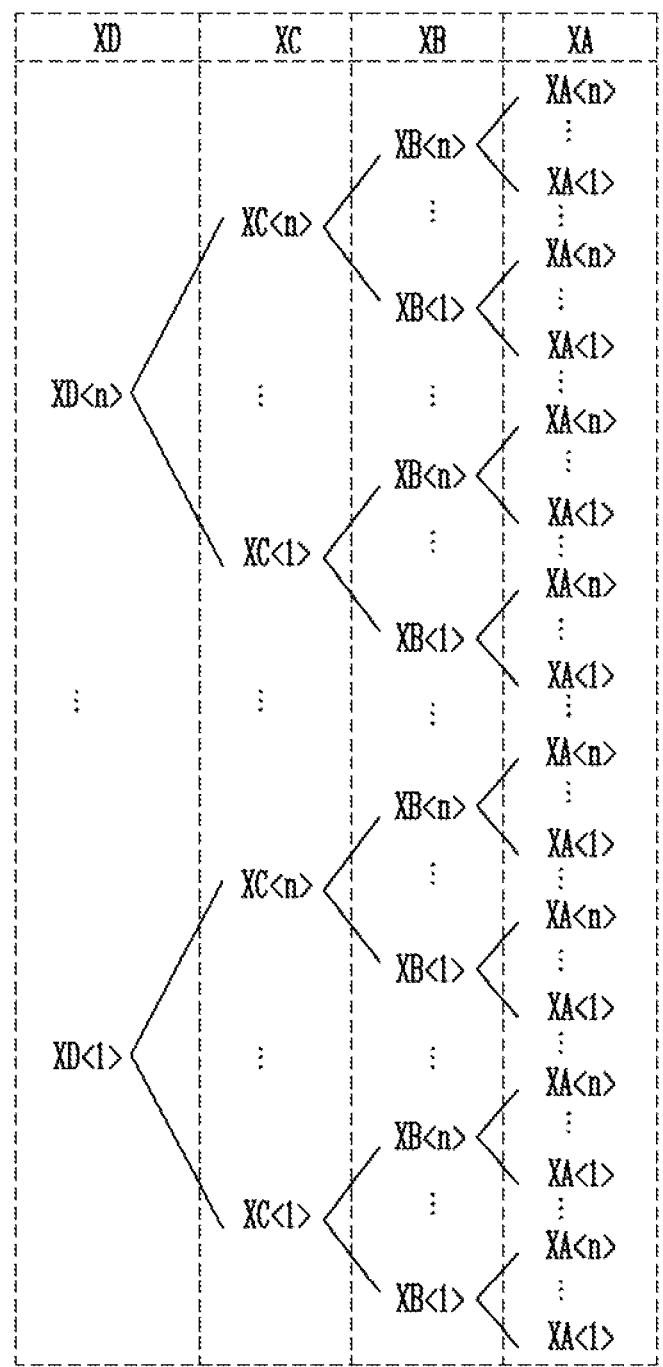
FIG. 8 is a diagram illustrating row addresses.

FIG. 8 is a diagram illustrating row addresses.

Referring to FIG. 8, the row addresses are values decoded by the control circuit 120 in FIG. 2. For example, when an address ADD is input to the control circuit, the control circuit may generate the first upper address XD<n:1> by decoding the address ADD, generate the second upper address XC<n:1> by decoding the first upper address XD<n:1>, generate the third upper address XB<n:1> by decoding the second upper address XC<n:1> and generate the lowest addresses XA<n:1> by decoding the third upper address XB<n:1>. XD is a value represented by XD<n:1>, XC is a value represented by XC<n:1>, XB is a value represented by XB<n:1>, and XA is a value represented by XA<n:1>. As disclosed above, XA is defined as the lowest addresses, XD as the first upper address, XC as the second upper address, XB as the third upper address, and the first to third upper addresses XD, XC and XB as the upper address.

Referring back to FIG. 4, the NAND gate 401 may get the first node N1 as logic low when all the upper address XB, XC and XD are '1'. If one or more of the upper addresses XB, XC and XD are '0', the NAND gate 401 may output a signal that is logic high to the first node N1.

The reversing circuit 420 may include an inverter 402 that may reverse the signal of the first node N1 and output the reversed signal to the second node N2 and a first switch 403 that may transmit the signal of the second node N2 to a third node N3 in response to the precharge signal PRECH. The first switch 403 may be formed of an NMOS transistor.

The pull-up circuit 430 may include a second switch 404 and a third switch 405 coupled in series between a high voltage supply node VPP and the third node N3. The second switch 404 may be formed of a depletion high voltage NMOS transistor in order to control an amount of a current flowing through the pull-up circuit 430 according to the potential of the third node N3. The third switch 405 may form a current path between the second switch 404 and the third node N3 in response to the potential of the first node N1 and may be a high voltage PMOS transistor.

The depletion high voltage NMOS transistor has a threshold voltage of a negative value. As such, even if a voltage of 0V is applied to a gate of the depletion high voltage NMOS transistor, a current passes through the depletion high voltage NMOS transistor. Accordingly, at an initial stage, even if a voltage of the third node N3 is not sufficiently high, the second switch 404 of the depletion high voltage NMOS transistor is turned on and a current flows through the pull-up circuit 430.

When the first node N1 is logic low, the third switch 405 is turned on and the turned-on second and third switches 404 and 405 electrically connect the high voltage supply node VPP and the third node N3. As a result, a voltage of the third node N3 is pulled up.

Input nodes of the first to nth switching circuits SW1 to SWn may be coupled in common to the third node N3, and output nodes may be coupled to different nodes. Since the first to nth switching circuits SW1 to SWn may be configured as the same as each other, the nth switching circuit SWn will be described as an example for convenience.

The nth switching circuit SWn may include a fourth switch 406 that may electrically connect the third node N3 and a fourth node N4 in response to the precharge high voltage PRECH_H and a fifth switch 407 that may discharge the fourth node N4 in response to the nth selection signal XA<n>_N.

The fourth and fifth switches 406 and 407 may be formed of a NMOS transistor, and particularly, the fourth switch 405 may be formed of a high voltage NMOS transistor.

A drain of the fourth switch 406 corresponds to an input node of the nth switch circuit SWn or the third node N3, and a source corresponds to an output node of the nth switching circuit SWn or the fourth node N4.

Among the switching circuits SW1 to SWn configured the same as each other, one of the selection signals XA<1>_N to XA<n>_N, which is logic low and different from the others, allows corresponding switching circuit to output corresponding one of the block selection voltages VBLK1 to VBLKn that is logic high. The precharge high voltage PRECH_H is applied in common to gates of the fourth switches 406 of the switching circuits SW1 to SWn. The selection signals XA<1>_N to XA<n>_N are applied to gates of the fifth switches 407 of the switching circuits SW1 to SWn, respectively. One of the selection signals XA<1>_N to XA<n>_N is logic low, and the remaining selection signals are logic high, which be disclosed below. Accordingly, one of the switching circuits SW1 to SWn corresponding to the selection signal that is logic low may output corresponding one of the block selection voltages VBLK1 to VBLKn that is logic high. For example, if the nth selection signal XA<n>_N is logic low and the remaining selection signals XA<1>_N to XA<n−1>_N are logic high, when precharge high voltage PRECH_H is applied to the switching circuits SW1 to SWn in the state where the block selection voltage VBLK is applied to the third node N3, the nth switching circuit SWn, which receives the nth selection signal XA<n>_N, outputs the nth block selection voltage VBLKn through the output node. The fifth switches 407 of the remaining switching circuits SW1 to SWn−1 correspond ng to the remaining selection signals XA<1>_N to XA<n−1>_N discharge the fourth node N4 or the output nodes of the remaining switching circuits SW1 to SWn−1 in response to the remaining selection signals XA<1>_N to XA<n−1>_N. The nth block selection voltage VBLKn is output, whereas the remaining block selection voltages VBLK1 to VBLKn−1 are not output.

Since the first to nth pass transistor groups PTG1 to PTGn may be configured the same as each other, the nth pass transistor group PTGn will be described as an example for convenience.

The nth pass transistor group PTGn may include a plurality of high voltage pass transistors 408. The drains of the pass transistors 408 may be coupled to the global word lines GWL, respectively, the sources may be coupled to the nth local word lines LWLn, respectively, and the gates may be coupled in common to the fourth node N4, which is an output node of the nth switching circuit SWn. Accordingly, when the nth block selection voltage VBLKn is output from the nth switching circuit SWn, all of the pass transistors 408 of the nth pass transistor group PTGn may be turned on, and a voltage applied to the global word lines GWL may be transmitted to the nth local word lines LWLn. That is, the nth memory block coupled to the nth local word lines LWLn is selected. As disclosed above, the nth block selection voltage VBLKn is output, whereas the remaining first to n−1th block selection voltages VBLK1 to VBLKn−1 are not output. As a result, the first to n−1th pass transistor groups PTG1 to PTGn−1 do not transmit the voltage of the global word lines GWL to the first to n−1th local word lines LWL1 to LWLn−1.

Figure 5:
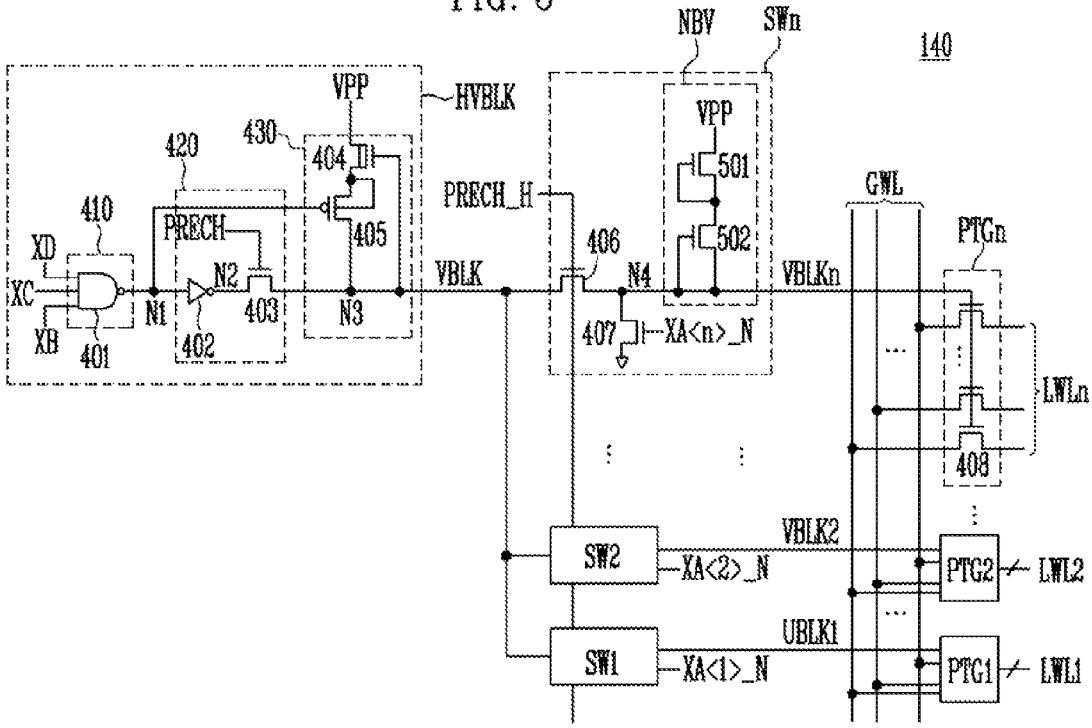
FIG. 5 is a circuit diagram illustrating in detail a row decoder shown in FIG. 3 according to an embodiment of the present invention.

FIG. 5 is a circuit diagram illustrating in detail a row decoder shown in FIG. 3 according to an embodiment of the present invention.

Referring to FIG. 5, as described in an embodiment shown in FIG. 4, the row decoder 140 may include the high voltage generating circuit HVBLK, the first to nth switching circuits SW1 to SWn, and the first to nth pass transistor groups PTG1 to PTGn. However, in an embodiment, a protective circuit NBV that may protect the pass transistors 408 may be further included, which will be described later.

The high voltage generating circuit HVBLK may include an address logic combination circuit 410, a reversing circuit 420 and a pull-up circuit 430.

The address logic combination circuit 410 may include a NAND gate 401 that may perform NAND operation to the upper addresses XB, XC and XD input to the row decoder 140 and output the result of the NAND operation to the first node N1.

The NAND gate 401 may get the first node N1 logic low when all the upper address XB, XC and XD are '1'. If one or more of the upper addresses XB, XC and XD are '0' the NAND gate 401 may output a signal that is logic high to the first node N1.

The reversing circuit 420 may include an inverter 402 that may reverse the signal of the first node N1 and output the reversed signal to the second node N2 and a first switch 403 that may transmit the signal of the second node N2 to a third node N3 in response to the precharge signal PRECH. The first switch 403 may be formed of an NMOS transistor.

The pull-up circuit 430 may include a second switch 404 and a third switch 405 coupled in series between a high voltage supply node VPP and the third node N3. The second switch 404 may be formed of a depletion high voltage NMOS transistor in order to control an amount of a current flowing through the pull-up circuit 430 according to the potential of the third node N3. The third switch 405 may form a current path between the second switch 404 and the third node N3 in response to the potential of the first node N1 and may be a high voltage PMOS transistor.

The depletion high voltage NMOS transistor has a threshold voltage of a negative value. As such, even if a voltage of 0V is applied to a gate of the depletion high voltage NMOS transistor, a current passes through the depletion high voltage NMOS transistor. Accordingly, at an initial stage, even if a voltage of the third node N3 is not sufficiently high, the second switch 404 of the depletion high voltage NMOS transistor is turned on and a current flows through the pull-up circuit 430.

When the first node N1 is logic low, the third switch 405 is turned on and the turned-on second and third switches 404 and 405 electrically connect the high voltage supply node VPP and the third node N3. As a result, a voltage of the third node N3 is pulled up.

Input nodes of the first to nth switching circuits SW1 to SWn may be coupled in common to the third node N3, and output nodes may be coupled to different nodes. Since the first to nth switching circuits SW1 to SWn may be configured as the same as each other, the nth switching circuit SWn will be described as an example for convenience.

The nth switching circuit SWn may include the fourth switch 406 that may electrically connect the third node N3 and the fourth node N4, the fifth switch 407 that may discharge the fourth node N4 in response to the nth selection signal XA<n>_N and, the protective circuit NBV that may prevent the potential of the output node of the first to nth switching circuits SW1 to SWn from increasing to a value greater than a critical value.

The fourth and fifth switches 406 and 407 may be formed as an NMOS transistor. Especially, the fourth switch 406 may be formed of a high voltage NMOS transistor.

A drain of the fourth switch 406 corresponds to an input node of the nth switch circuit SWn or the third node N3, and a source corresponds to an output node of the nth switching circuit SWn or the fourth node N4.

Among the switching circuits SW1 to SWn configured the same as each other, one of the selection signals XA<1>_N to XA<n>_N, which is logic low and different from the others, allows corresponding switching circuit to output corresponding one of the block selection voltages VBLK1 to VBLKn that is logic high. The precharge high voltage PRECH_H is applied in common to gates of the fourth switches 406 of the switching circuits SW1 to SWn. The selection signals XA<1>_N to XA<n>_N are applied to gates of the fifth switches 407 of the switching circuits SW1 to SWn, respectively. One of the selection signals XA<1>_N to XA<n>_N is logic low, and the remaining selection signals are logic high. Accordingly, one of the switching circuits SW1 to SWn corresponding to the selection signal that is logic low may output corresponding one of the block selection voltages VBLK1 to VBLKn that is logic high. For example, if the nth selection signal XA<n>_N is logic low and the remaining selection signals XA<1>_N to XA<n−1>_N are logic high, when precharge high voltage PRECH_H is applied to the switching circuits SW1 to SWn in the state where the block selection voltage VBLK is applied to the third node N3, the nth switching circuit SWn, which receives the nth selection signal XA<n>_N, outputs the nth block selection voltage VBLKn through the output node. The fifth switches 407 of the remaining switching circuits SW1 to SWn−1 corresponding to the remaining selection signals XA<1>_N to XA<n−1>_N discharge the fourth node N4 or the output nodes of the remaining switching circuits SW1 to SWn−1 in response to the remaining selection signals XA<1>_N to XA<n−1>_N. The nth block selection voltage VBLKn is output, whereas the remaining block selection voltages VBLK1 to VBLKn−1 are not output.

The protective circuit NBV may include one or more diode typed switches 501 and 502 coupled in series between the high voltage supply node VPP and the fourth node N4. For example, the diode typed switches 501 and 502 may be configured to sequentially form a current path in a direction from the fourth node N4 to the high voltage supply node VPP. For instance, a first diode typed switch 501 and a second diode typed switch 502 may be included in the protective circuit NBV. In this case, a drain and a gate of the second diode typed switch 502 may be coupled in common to the fourth node N4, a drain and a gate of the first diode typed switch device 501 may be coupled in common to a source of the second diode typed switch device 502, and a source of the first diode typed switch device 501 may be coupled to the high voltage supply node VPP. When the level of the voltage applied to the fourth node N4 increases, the second diode typed switch 502 and the first diode typed switch 501 are sequentially turned on, and as a result, the fourth node N4 and the high voltage supply node VPP are coupled to each other. Therefore, the voltage applied to the fourth node N4 may not increase to be greater than the high voltage VPP. For example, when the nth block selection voltage VBLKn is applied to the fourth node N4, the nth block selection voltage VBLKn may not increase to a voltage that is greater than a break down voltage of the pass transistors 408 due to the protective circuit NBV. As such, since application of a voltage greater than the break down voltage to the gates of the pass transistors 408 may be prevented, the pass transistors 408 may be secured.

Since the first to nth pass transistor groups PTG1 to PTGn may be configured the same as each other, the nth pass transistor group PTGn will be described as an example for convenience.

The nth pass transistor group PTGn may include a plurality of high voltage pass transistors 408. The drains of the pass transistors 408 may be coupled to the global word lines GWL, respectively, the sources may be coupled to the nth local word lines LWLn, respectively, and the gates may be coupled in common to the fourth node N4, which is an output node of the nth switching circuit SWn. Accordingly, when the nth block selection voltage VBLKn is output from the nth switching circuit SWn, all of the pass transistors 408 of the nth pass transistor group PTGn may be turned on, and a voltage applied to the global word lines GWL may be transmitted to the nth local word lines LWLn. That is, the nth memory block coupled to the nth local word lines LWLn is selected. As disclosed above, the nth block selection voltage VBLKn is output, whereas the remaining first to n−1th block selection voltages VBLK1 to VBLKn−1 are not output. As a result, the first to n−1th pass transistor groups PTG1 to PTGn−1 may not transmit the voltage of the global word lines GWL to the first to n−1th local word lines LWL1 to LWLn−1.

Figure 6:
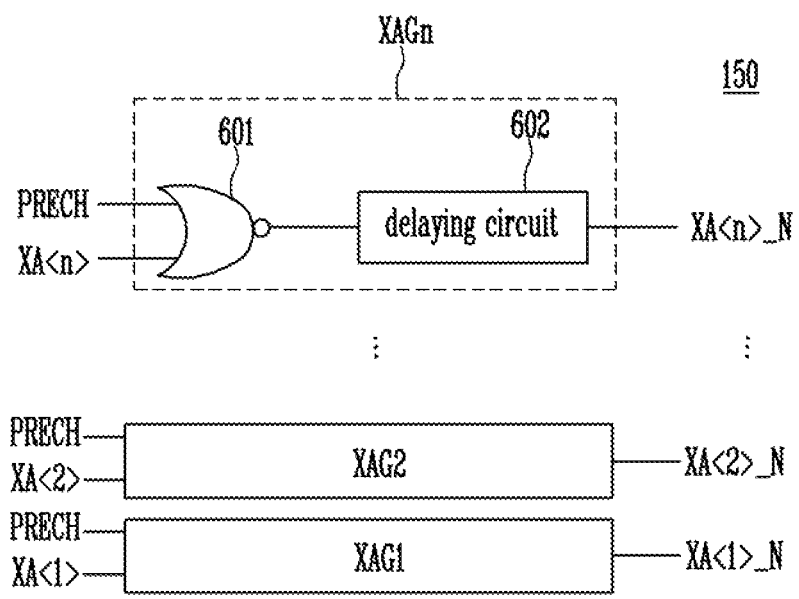
FIG. 6 is a circuit diagram illustrating in detail a selection signal generator shown in FIG. 2.

FIG. 6 is a circuit diagram illustrating in detail a selection signal generator shown in FIG. 2.

Referring to FIG. 6, the selection signal generator 150 may include first to nth selection signal generating circuits XAG1 to XAGn. Since the first to nth selection signal generating circuits XAG1 to XAGn may be configured the same as each other, the nth selection signal generating circuit XAGn will be described as an example for convenience.

The nth selection signal generating circuit XAGn may include a NOR gate 601 that may perform NOR operation to the precharge signal PRECH and the nth bit of the lowest addresses XA<n> and a delaying circuit 602 that may delay a signal output from the NOR gate 601.

The NOR gate 601 may output logic high signal when the nth bit of the lowest addresses XA<n> and the precharge signal PRECH are logic low. When one or more of the nth bit of the lowest addresses XA<n> and the precharge signal PRECH are logic high, the NOR gate 601 may output logic low signal.

The delaying circuit 602 delays a signal output from the NOR gate 601 for a predetermined time and outputs the nth selection signal XA<n>_N in order to prevent collision of the selection signals XA<1>_N to XA<n>_N and the precharge high voltage PRECH_H, all of which are input to the switching circuits SW1 to SWn. The delaying circuit 602 may be configured to output the nth selection signal XA<n>_N after the precharge high voltage PRECH_H is generated at the level shifter 160 in FIG. 2. For example, the delaying circuit 602 may be formed of a plurality of inverters.

For selection of the memory block, one of the first to nth bits of the lowest addresses XA<n:1> is logic high, whereas the remaining bits of the lowest addresses are logic low. When the precharge signal PRECH is logic low, one of the selection signal generating circuits XAG1 to XAGn, which receives logic high bit of the lowest addresses XA<n:1>, may output the selection signal, which is logic low, and the remaining selection signal generating circuits, which receives logic low bits of the lowest addresses XA<n:1>, may output the selection signals, which is logic high.

Figure 7:
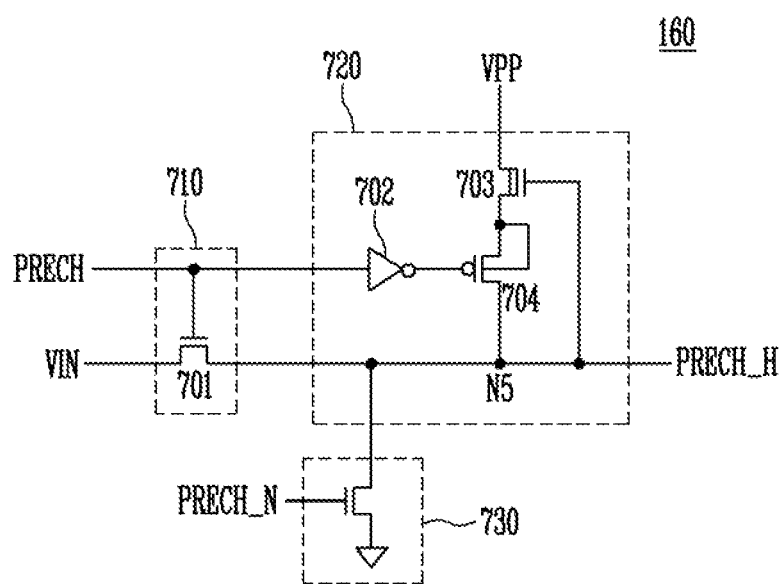
FIG. 7 is a circuit diagram illustrating in detail a level shifter shown in FIG. 2.

FIG. 7 is a circuit diagram Illustrating in detail a level shifter shown in FIG. 2.

Referring to FIG. 7, the level shifter 160 may include an initial voltage reversing circuit 710, a pull-up circuit 720 and a discharge circuit 730. The initial voltage reversing circuit 710 may include a transmission switch 701 that may transmit an initial voltage VIN to a fifth node N5 in response to the precharge signal PRECH. For example, the transmission switch 701 may be formed of an NMOS transistor that is turned on in response to the precharge signal PRECH. A drain of the transmission switch 701 is coupled to an initial voltage supply node VIN, and a source is coupled to the fifth node N5. When the precharge signal PRECH is applied to a gate of the transmission switch 701, the transmission switch 701 may be turned on, and the initial voltage VIN may be transmitted to the fifth node N5. For example, the initial voltage VIN may be a power voltage.

The pull-up circuit 720 may include an inverter 702 that may reverse the precharge signal PRECH, a sixth switch 703 that may pull up the voltages of the fifth node N5 and a seventh switch 704. The sixth switch 703 and the seventh switch 704 are coupled in series between the high voltage supply node VPP and the fifth node N5.

The sixth switch 703 may be formed of the depletion high voltage NMOS transistor in order to control the amount of the current flowing through the pull-up circuit 720 according to the potential of the fifth node N5.

The seventh switch 704 may be turned on in response to a signal output from the inverter 702 and may be formed of the high voltage PMOS transistor. The depletion high voltage NMOS transistor has a threshold voltage of a negative value, even though a voltage of 0V is applied to a gate of the depletion high voltage NMOS transistor, and the current may flow through the depletion high voltage NMOS transistor. Accordingly, at an initial stage, even though the initial voltage VIN having a low level at the fifth node N5 is applied, the sixth switch 703 of the depletion high voltage NMOS transistor may be turned on and a current flows through the pull-up circuit 720. If a logic low signal is output from the inverter 702, the sixth and seventh switches 703 and 704 may be turned on, and electrically connect the high voltage supply node VPP and the fifth node N5. Thus, the voltage of the fifth node N5 increases. The voltage of the fifth node N5 is pulled up to be the precharge high voltage PRECH_H.

The discharge circuit 730 may discharge the fifth node N5 when the reverse precharge signal PRECH_N, which is a reverse signal of the precharge signal PRECH, is enabled. For instance, the discharge circuit 730 may be coupled between the fifth node N5 and a ground node and may be formed of an NMOS transistor that is turned on in response to the precharge signal PRECH_N.

Hereinafter, the operation in which the memory block is selected will be described.

Figure 9:
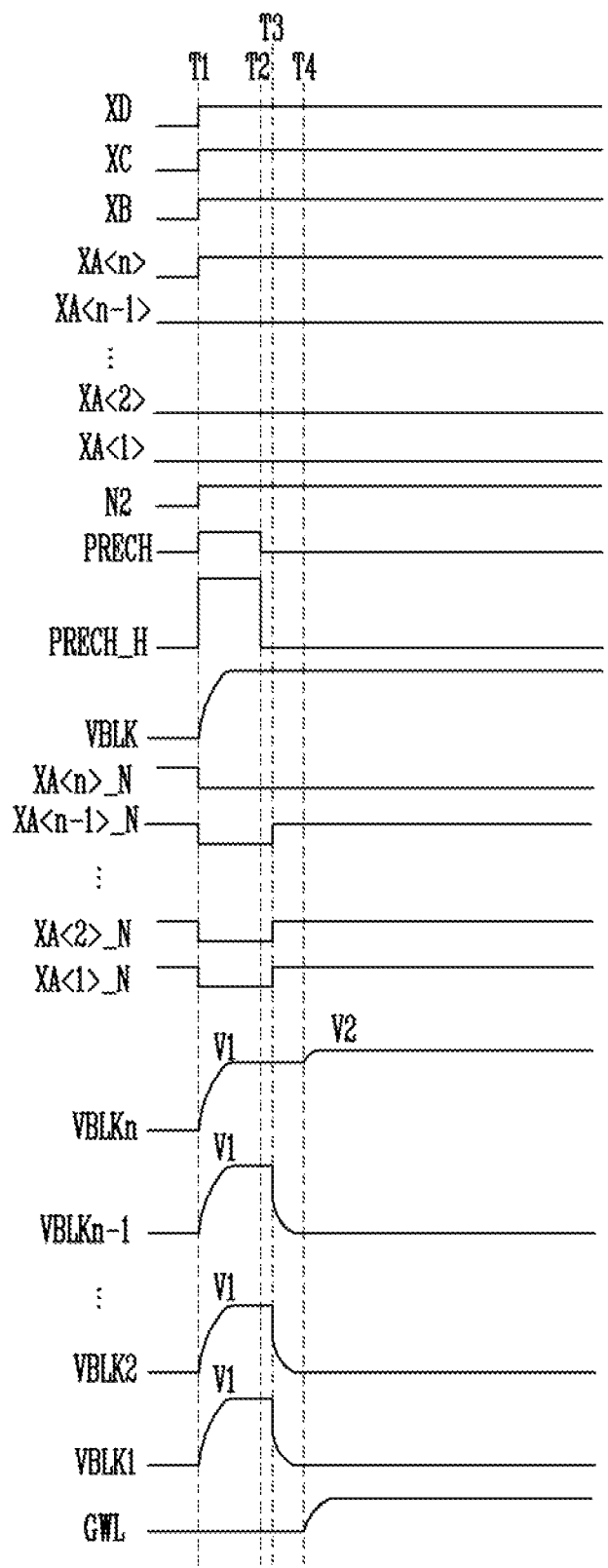
FIG. 9 is a time diagram illustrating an operation of a row decoder according to an embodiment of the present invention.

FIG. 9 is a time diagram illustrating an operation of a row decoder according to an embodiment of the present invention.

Referring, to FIGS. 4, 5, 6, 7, and a case in which the nth memory block is selected will be described as an example.

Precharge Section (T1 to T2)

In the beginning of the precharge section, the row addresses XA<n:1>, XB<n:1>, XC<n:1> and XD<n:1> are input to the block selection circuit 200. In an embodiment, it is assumed that the nth memory block is selected, and as such, the row addresses XA<n:1>, XB<n:1>, XC<n:1> and XD<n:1> together represent row addresses that have value of '1111', which means that the most significant bits XA<n>, XB<n>, XC<n> and XD<n> of the row addresses XA<n:1>, XB<n:1>, XC<n:1> and XD<n:1> are '1' and the other bits are '0'.

The upper addresses XB, XC and XD are input to the row decoder 140, and the first to nth bits of the lowest addresses XA<1> to XA<n> are input to the selection signal generator 150. In detail, when the upper addresses XB, XC and XD representing '111' are input to the NAND gate 401 of the row decoder 140, the NAND gate 401 outputs '0' to the first node N1. That is, the first node N1 is logic low. The inverter 402 of the reversing circuit 420 reverses the potential of the first node N1 and outputs a logic high signal to the second node N2.

The precharge signal PRECH that is logic high turns on the first switch 403 of the reversing circuit 420, and the voltage of the second node N2 is transmitted to the third node N3. Since the first node N1 is in the logic low state, the second and third switches 404 and 405 of the pull-up circuit 430 are turned on, and the high voltage supply node VPP and the third node N3 are electrically connected. As a result, the voltage of the third node N3 is pulled up. The pulled-up voltage of the third node N3 increases the voltage applied to the gate of the second switch 404, which makes the voltage of the third node N3 progressively increase. As such, the voltage of the third node N3 increases, and the block selection voltage VBLK is generated.

Also, when the precharge signal PRECH becomes logic high, the level shifter 160 outputs the precharge high voltage PRECH_H.

The precharge high voltage PRECH_H turns on the fourth switches 406 of the switching circuits SW1 to SWn simultaneously, and the block selection voltages VBLK1 to VBLKn having a first level V1 are output.

Since the precharge signal PRECH is logic high, the NOR gates 601 included in the selection signal generating circuits XAG1 to XAGn output the logic low selection signals XA<1>_N to XA<n>_N regardless of the lowest addresses XA<n:1>. Accordingly, while the precharge signal PRECH stays logic high, the logic low selection signals XA<1>_N to XA<n>_N are output. Therefore, the fifth switches 407 included in the switch circuits SW1 to SWn of the row decoder 140 are turned off, and the block selection voltages VBLK1 to VBLKn having the first level V1 are output without discharge.

Delay Section (T2 to T3)

In the beginning of the delay section, the precharge signal PRECH becomes logic low, the pull-up circuit 720 of the level shifter 160 is deactivated, and the discharge circuit 730 is activated. That is, when the precharge signal PRECH becomes logic low, the reverse precharge signal PRECH_N becomes logic high. The NMOS transistor of the discharge circuit 730 is turned on, and the fifth node N5 is discharged. Accordingly, the precharge high voltage PRECH_H applied to the fifth node N5 becomes logic low. The delay section corresponds to a predetermined delay time of the delaying circuit 602.

Memory Block Selection Section (T3 to T4)

In the memory block selection section, the nth selection signal XA<n>_N maintains logic low by the selection signal generator 150, whereas the remaining first to n−1th selection signals XA<1>_N to XA<n−1>_N become logic high. Since the nth bit of the lowest addresses XA<n> is '1.', the nth selection signal XA<n>_N is generated as logic low.

Even though it is assumed in the embodiment that the nth memory block is to be selected and thus the nth bit of the lowest addresses XA<n> is '1', a memory block to be selected decides which one of the bits in the lowest addresses XA<1> to XA<n> is logic high.

Since the nth selection signal XA<n>_N is logic low, the output nodes of the first to n−1th switching circuits SW1 to SWn−1 except for the nth switching circuit SWn are discharged. That is, since the nth switching circuit SWn outputs the nth block selection voltage VBLKn, the pass transistors 408 included in the nth pass transistor group PTGn are turned on. Accordingly, since the global word lines GWL and the nth local word lines LWLn are coupled to each other, the nth memory block (not shown) coupled to the nth local word lines LWLn is selected. Since the remaining first to n−1th transistor groups PTG1 to PTGn−1 are deactivated, the first to n−1th memory blocks (not shown) coupled to the first to n−1th local word lines LWL1 to LWLn−1 are unselected.

Selected Memory Block Operation Section (T4)

In the selected memory block operation section, operating voltages are applied to the global word lines GWL, and the operation of the selected nth memory block is performed. Even though the nth block selection voltage VBLKn may not increase to a level to turn on the nth pass transistors 408, when operating voltages are applied to the global word lines GAIL, the nth block selection voltage VBLKn is increased to the second level V2 due to a coupling effect. Accordingly, the nth pass transistors 408 may be turned on due to the nth block selection voltage VBLKn of the second level V2.

In embodiments disclosed with reference to FIGS. 4 and 5, the switching circuits SW1 to SWn use the precharge high voltage PRECH_H, which is generated by the level shifter 160.

In embodiments that will be described below, a row decoder that does not use the precharge high voltage PRECH_H is proposed in order to further reduce the size of the block selection circuit 200. Accordingly, the level shifter 160 in FIGS. 2 and 3 may not be necessary in the embodiments, which will be described below.

Figure 10:
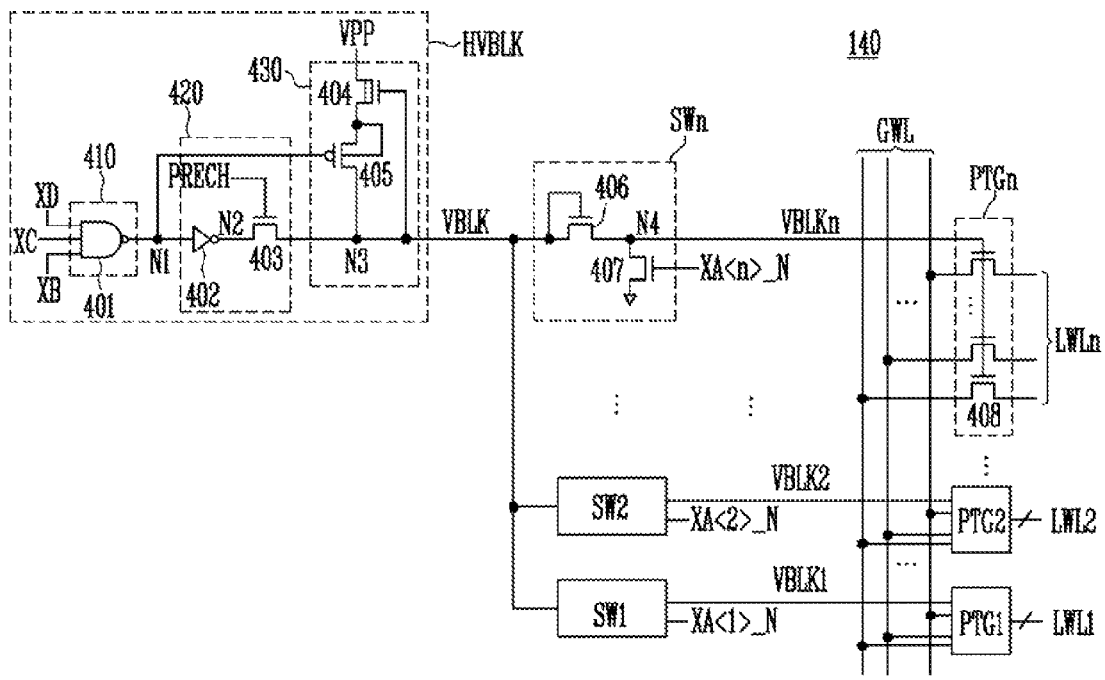
FIG. 10 is a circuit diagram illustrating in detail a row decoder shown in FIG. 3 according to an embodiment of the present invention.

FIG. 10 is a circuit diagram illustrating in detail a row decoder shown in FIG. 3 according to an embodiment of the present invention.

Referring to FIG. 10, the high voltage generating circuit HVBLK may include an address logic combination circuit 410, a reversing circuit 420 and a pull-up circuit 430.

The address logic combination circuit 410 may include a NAND gate 401 that may perform NAND operation to the upper addresses XB, XC and XD input to the row decoder 140 and output the result of the NAND operation to a first node N1.

The NAND gate 401 may get the first node N1 as logic low when all the upper address XB, XC and XD are '1'. If one or more of the upper addresses XB, XC and XD are '0', the NAND gate 401 may output a signal that is logic high to the first node N1.

The reversing circuit 420 may include an inverter 402 that may reverse the signal of the first node N1 and output the reversed signal to the second node N2 and a first switch 403 that may transmit the signal of the second node N2 to a third node N3 in response to the precharge signal PRECH. The first switch 403 may be formed of an NMOS transistor.

The pull-up circuit 430 may include a second switch 404 and a third switch 405 coupled in series between a high voltage supply node VPP and the third node N3. The second switch 404 may be formed of a depletion high voltage NMOS transistor in order to control an amount of a current flowing through the pull-up circuit 430 according to the potential of the third node N3. The third switch 405 may form a current path between the second switch 404 and the third node N3 in response to the potential of the first node N1 and may be a high voltage PMOS transistor.

The depletion high voltage NMOS transistor has a threshold voltage of a negative value. As such, even if a voltage of 0V is applied to a gate of the depletion high voltage NMOS transistor, a current passes through the depletion high voltage NMOS transistor. Accordingly, at an initial stage, even if a voltage of the third node N3 is not sufficiently high, the second switch 404 of the depletion high voltage NMOS transistor may be turned on and a current flows through the pull-up circuit 430.

When the first node N1 is logic low, the third switch 405 may be turned on and the turned-on second and third switches 404 and 405 electrically connect the high voltage supply node VPP and the third node N3. As a result, a voltage of the third node N3 is pulled up.

Input nodes of the first to nth switching circuits SW1 to SWn may be coupled in common to the third node N3, and output nodes may be coupled to different nodes. Since the first to nth switching circuits SW1 to SWn may be configured as the same as each other, the nth switching circuit SWn will be described as an example for convenience.

The nth switching circuit SWn may include a fourth switch 406 that may electrically connect the third node N3 and a fourth node N4 and transmit the block selection voltage VBLK from the third node N3 to the fourth node N4 in response to the block selection voltage VBLK and a fifth switch 407 that may discharge the fourth node N4 in response to the nth selection signal XA<n>_N.

The fourth and fifth switches 406 and 407 may be formed of a NMOS transistor, and particularly, the fourth switch 406 may be formed of a diode typed high voltage NMOS transistor.

The drain and the gate of the fourth switch 406 are coupled to the input node of the nth switching circuit SWn or the third node N3, and the source is coupled to the output node of the nth switching circuit SWn or the fourth node N4.

Among the switching circuits SW1 to SWn configured the same as each other, one of the selection signals XA<1>_N to XA<n>_N, which is logic low and different from the others, allows corresponding switching circuit to output corresponding one of the block selection voltages VBLK1 to VBLKn that is logic high. The selection signals XA<1>_N to XA<n>_N are applied to gates of the fifth switches 407 of the switching circuits SW1 to SWn, respectively. One of the selection signals XA<1>_N to XA<n>_N is logic low, and the remaining selection signals are logic high. Accordingly, one of the switching circuits SW1 to SWn corresponding to the selection signal that is logic low may output corresponding one of the block selection voltages VBLK1 to VBLKn that is logic high. For example, if the nth selection signal XA<n>_N is logic low and the remaining selection signals XA<1>_N to XA<n−1>_N are logic high, when the block selection voltage VBLK is applied to the third node N3, the nth switching circuit SWn, which receives the nth selection signal XA<n>_N, outputs the nth block selection voltage VBLKn through the output node. The fifth switches 407 of the remaining switching circuits SW1 to SWn−1 corresponding to the remaining selection signals XA<1>_N to XA<n−1>_N discharge the fourth node N4 or the output nodes of the remaining switching circuits SW1 to SWn−1 in response to the remaining selection signals XA<1>_N to XA<n−1>_N. The nth block selection voltage VBLKn is output, whereas the remaining block selection voltages VBLK1 to VBLKn−1 are not output.

Since the first to nth pass transistor groups PTG1 to PTGn may be configured the same as each other, the nth pass transistor group PTGn will be described as an example for convenience.

The nth pass transistor group PTGn may include a plurality of high voltage pass transistors 408. The drains of the pass transistors 408 may be coupled to the global word lines GWL, respectively, the sources may be coupled to the nth local word lines LWLn, respectively, and the gates may be coupled in common to the fourth node N4, which is an output node of the nth switching circuit SWn. Accordingly, when the nth block selection voltage VBLKn is output from the nth switching circuit SWn, all of the pass transistors 408 of the nth pass transistor group PTGn may be turned on, and a voltage applied to the global word lines GWL may be transmitted to the nth local word lines LWLn. That is, the nth memory block coupled to the nth local word lines LWLn is selected. As disclosed above, the nth block selection voltage VBLKn is output, whereas the remaining first to n−1th block selection) voltages VBLK1 to VBLKn−1 are not output. As a result, the first to n−1th pass transistor groups PTG1 to PTGn−1 do not transmit the voltage of the global word lines GWL to the first to n−1th local word lines LWL1 to LWLn−1.

Figure 11:
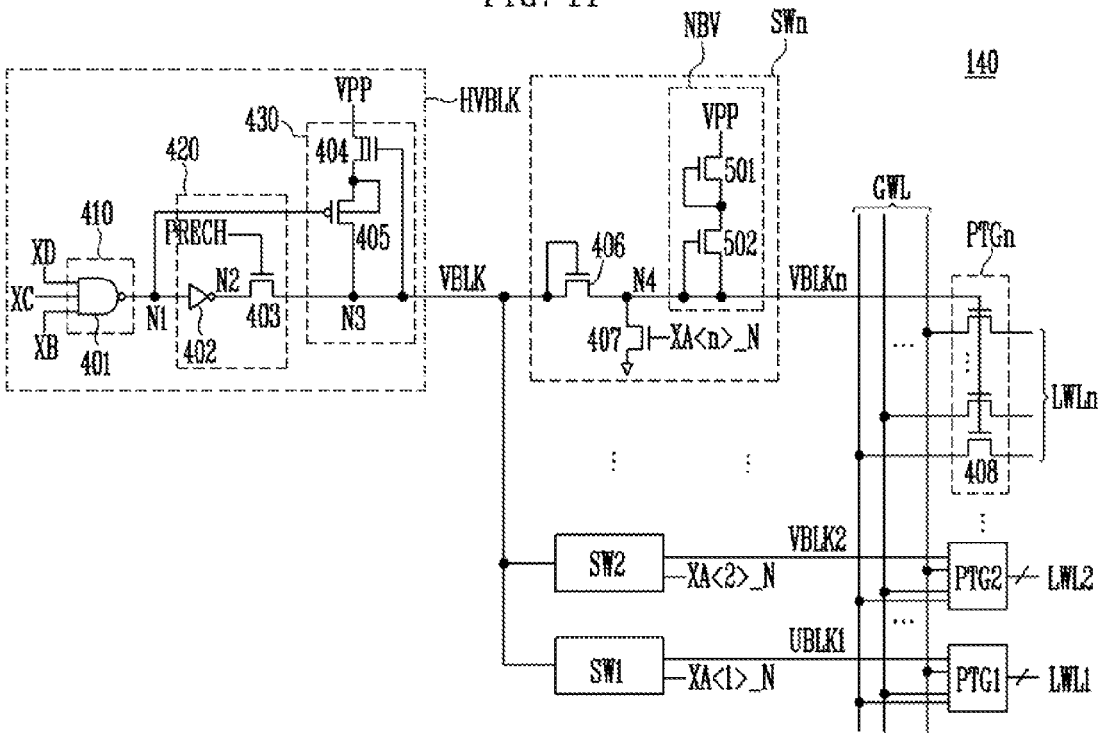
FIG. 11 is a circuit diagram illustrating in detail a row decoder shown in FIG. 3 according to an embodiment of the present invention.

FIG. 11 is a circuit diagram illustrating in detail a row decoder shown in FIG. 3 according to an embodiment of the present invention.

Referring to FIG. 11, as described in an embodiment shown in FIG. 10, the row decoder 140 may include the high voltage generating circuit HVBLK, the first to nth switching circuits SW1 to SWn and the first to nth pass transistor groups PTG1 to PTGn. However, in an embodiment, a protective circuit NBV that may protect the pass transistors 408 may be included, which will be described later.

The high voltage generating circuit HVBLK may include an address logic combination circuit 410, a reversing circuit 420, and a pull-up circuit 430.

The address logic combination circuit 410 may include a NAND gate 401 that may perform NAND operation to the upper addresses XB, XC and XD input to the row decoder 140 and output the result of the NAND operation to the first node N1.

The NAND gate 401 may get the first node N1 logic low when all the upper address XB, XC and XD are '1'. If one or more of the upper addresses XB, XC and XD are '0', the NAND gate 401 may output a signal that is logic high to the first node N1.

The reversing circuit 420 may include an inverter 402 that may reverse the signal of the first node N1 and output the reversed signal to the second node N2 and a first switch 403 that may transmit the signal of the second node N2 to a third node N3 in response to the precharge signal PRECH. The first switch 403 may be formed of an NMOS transistor.

The pull-up circuit 430 may include a second switch 404 and a third switch 405 coupled in series between a high voltage supply node VPP and the third node N3. The second switch 404 may be formed of a depletion high voltage NMOS transistor in order to control an amount of a current flowing through the pull-up circuit 430 according to the potential of the third node N3. The third switch 405 may form a current path between the second switch 404 and the third node N3 in response to the potential of the first node N1 and may be a high voltage PMOS transistor.

The depletion high voltage NMOS transistor has a threshold voltage of a negative value. As such, even if a voltage of 0V is applied to a gate of the depletion high voltage NMOS transistor, a current passes through the depletion high voltage NMOS transistor. Accordingly, at an initial stage, even if a voltage of the third node N3 is not sufficiently high, the second switch 404 of the depletion high voltage NMOS transistor is turned on and a current flows through the pull-up circuit 430.

When the first node N1 is logic low, the third switch 405 is turned on and the turned-on second and third switches 404 and 405 electrically connect the high voltage supply node VPP and the third node N3. As a result, a voltage of the third node N3 is pulled up.

Input nodes of the first to nth switching circuits SW1 to SWn may be coupled in common to the third node N3, and output nodes may be coupled to different nodes. Since the first to nth switching circuits SW1 to SWn may be configured as the same as each other, the nth switching circuit SWn will be described as an example for convenience.

The nth switching circuit SWn may include the fourth switch 406 that may electrically connect the third node N3 and a fourth node N4 and transmit the block selection voltage VBLK from the third node N3 to the fourth node N4 in response to the block selection voltage VBLK, the fifth switch 407 that may discharge the fourth node N4 in response to the nth selection signal XA<n>_N, and the protective circuit NBV that may prevent the potential of the output node of the first to nth switching circuits SW1 to SWn from increasing to a value greater than a critical value.

The fourth and fifth switches 406 and 407 may be formed as an NMOS transistor. Especially, the fourth switch 406 may be formed of the diode typed high voltage NMOS transistor.

A drain of the fourth switch 406 corresponds to an input node of the nth switch circuit SWn or the third node N3, and a source corresponds to an output node of the nth switching circuit SWn or the fourth node N4.

Among the switching circuits SW1 to SWn configured the same as each other, one of the selection signals XA<1>_N to XA<n>_N, which is logic low and different from the others, allows corresponding switching circuit to output corresponding one of the block selection voltages VBLK1 to VBLKn that is logic high. The selection signals XA<1>_N to XA<n>_N are applied to gates of the fifth switches 407 of the switching circuits SW1 to SWn, respectively. One of the selection signals XA<1>_N to XA<n>_N is logic low, and the remaining selection signals are logic high. Accordingly, one of the switching circuits SW1 to SWn corresponding to the selection signal that is logic low may output corresponding one of the block selection voltages VBLK1 to VBLKn that is logic high. For example, if the nth selection signal XA<n>_N is logic low and the remaining selection signals XA<1>_N to XA<n−1>_N are logic high, when the block selection voltage VBLK is applied to the third node N3 the nth switching circuit SWn, which receives the nth selection signal XA<n>_N, outputs the nth block selection voltage VBLKn through the output node. The fifth switches 407 of the remaining switching circuits SW1 to SWn−1 corresponding to the remaining selection signals XA<1>_N to XA<n−1>_N discharge the fourth node N4 or the output nodes of the remaining switching circuits SW1 to SWn−1 in response to the remaining selection signals XA<1>_N to XA<n−1>_N. The nth block selection voltage VBLKn is output, whereas the remaining block selection voltages VBLK1 to VBLKn−1 are not output.

The protective circuit NBV may include one or more diode typed switches 501 and 502 coupled in series between the high voltage supply node VPP and the fourth node N4. For example, the diode typed switches 501 and 502 may sequentially form a current path in a direction from the fourth node N4 to the high voltage supply node VPP. For instance, a first diode typed switch 501 and a second diode typed switch 502 may be included in the protective circuit NBV. In this case, a drain and a gate of the second diode typed switch 502 may be coupled in common to the fourth node N4, a drain and a gate of the first diode typed switch device 501 may be coupled in common to a source of the second diode typed switch device 502, and a source of the first diode typed switch device 501 may be coupled to the high voltage supply node VPP. When the level of the voltage applied to the fourth node N4 increases, the second diode typed switch 502 and the first diode typed switch 501 are sequentially turned on, and as a result, the fourth node N4 and the high voltage supply node VPP are coupled to each other. Therefore, the voltage applied to the fourth node N4 may not increase to be greater than the high voltage VPP. For example, when the nth block selection voltage VBLKn is applied to the fourth node N4, the nth block selection voltage VBLKn may not increase to a voltage that is greater than a break down voltage of the pass transistors 408 due to the protective circuit NBV. As such, since application of a voltage greater than the break down voltage to the gates of the pass transistors 408 may be prevented, the pass transistors 408 may be secured.

Since the first to nth pass transistor groups PTG1 to PTGn may be configured the same as each other, the nth pass transistor group PTGn be described as an example for convenience.

The nth pass transistor group PTGn may include a plurality of high voltage pass transistors 408. The drains of the pass transistors 408 may be coupled to the global word lines GWL, respectively, the sources may be coupled to the nth local word lines LWLn, respectively, and the gates may be coupled in common to the fourth node N4 which is an output node of the nth switching circuit SWn. Accordingly, when the nth block selection voltage VBLKn is output from the nth switching circuit SWn, all of the pass transistors 408 of the nth pass transistor group PTGn may be turned on, and a voltage applied to the global word lines GWL may be transmitted to the nth local word lines LWLn. That is, the nth memory block coupled to the nth local word lines LWLn is selected. As disclosed above, the nth block selection voltage VBLKn is output, whereas the remaining first to n−1th block selection voltages VBLK1 to VBLKn−1 are not output. As a result, the first to n−1th pass transistor groups PTG1 to PTGn−1 do not transmit the voltage of the global word lines GWL to the first to n−1th local word lines LWL1 to LWLn−1.

Although the above embodiments illustrated a case for selecting any one of the first to nth memory blocks, depending on circumstances, a plurality of memory blocks may be selected in response to the row addresses XA, XB, XC and XD.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used by itself or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A block selection circuit, comprising:
   a row decoder configured to select a memory block in response to upper addresses included in row addresses;
   a level shifter configured to output a precharge high voltage by increasing an input voltage in response to a precharge signal; and
   a selection signal generator configured to generate selection signals in response to lowest addresses included in the row addresses and the precharge high voltage,
   wherein the row decoder comprises:
   a high voltage generating circuit configured to output a block selection voltage in response to the upper addresses;
   switching circuits configured to receive the block selection voltage and the precharge high voltage and forward the block selection voltage through one of the switching circuits that is selected in response to the selection signals; and
   pass transistor groups configured to select the memory block in response to the forwarded block selection voltage.

2. The block selection circuit according to claim 1, wherein the upper addresses comprise a first upper address, a second upper address obtained by decoding the first upper address, and a third upper address obtained by decoding the second upper address, and
   wherein the lowest addresses are obtained by decoding the third upper address.

3. The block selection circuit according to claim 1, wherein the high voltage generating circuit comprises:
   a NAND gate configured to perform NAND operation in response to the upper addresses;
   a reversing circuit configured to reverse the result of the NAND operation in response to the precharge signal; and
   a pull-up circuit configured to generate the block selection voltage by pulling up the reversed result of the NAND operation.

4. The block selection circuit according to claim 3, wherein the reversing circuit comprises:
   an inverter configured to reverse the result of the NAND operation; and
   a first switch configured to output the reversed result of the NAND operation in response to the precharge signal.

5. The block selection circuit according to claim 3, wherein the pull-up circuit comprises:
   a second switch configured to control the amount of a current flowing through the pull-up circuit according to a potential of the reversed result of the NAND operation; and
   a third switch configured to form a current path between the second switch and the switching circuits in response to the potential of the result of the NAND operation.

6. The block selection circuit according to claim 1, wherein each of the switching circuits comprises:
   a fourth switch configured to receive the block selection voltage and forward the block selection voltage to corresponding one of the pass transistor groups in response to the precharge high voltage; and
   a fifth switch configured to discharge the block selection voltage received by the fourth switch in response to corresponding one of the selection signals.

7. The block selection circuit according to claim 6, wherein each of the switching circuits further comprises protective circuits configured to prevent the block selection voltage forwarded by the fourth switch from becoming greater than a critical value.

8. The block selection circuit according to claim 7, wherein the protective circuit comprises one or more diode typed switches coupled in series between a high voltage supply node and an output node of the fourth switch.

9. The block selection circuit according to claim 8, wherein the diode typed switches comprise an NMOS transistor configured to sequentially form a current path in a direction from the output node to the high voltage supply node.

10. The block selection circuit according to claim 1, wherein the selection signal generator comprises a plurality of selection signal generating circuits configured to generate selection signals in response to the precharge signal and the lowest addresses.

11. The block selection circuit according to claim 10, wherein each of the selection signal generating circuits comprises:
    a NOR gate configured to perform NOR operation to the precharge signal and corresponding one of bits in the lowest addresses; and
    a delaying circuit configured to output the result of NOR operation as corresponding one of the selection signals with a predetermined amount of time delay.

12. A block selection circuit comprising:
    a row decoder configured to select a memory block in response to upper addresses included in row addresses; and
    a selection signal generator configured to generate selection signals in response to lowest addresses included in the row addresses, wherein the lowest addresses are obtained by decoding the upper addresses,
    wherein the row decoder comprises:
    a high voltage generating circuit configured to output a block selection voltage in response to the upper addresses;
    switching circuits configured to receive the block selection voltage and forward the block selection voltage through one of the switching circuits that is selected in response to the selection signals; and pass transistor groups configured to select the memory block in response to the forwarded block selection voltage.

13. The block selection circuit according to claim 12, wherein the high voltage generating circuit comprises:
a NAND gate configured to perform NAND operation to the upper addresses;
a reversing circuit configured to reverse the result of the NAND operation; and
a pull-up circuit configured to generate the block selection voltage by pulling up the reversed result of the NAND operation.

14. The block selection circuit according to claim 13, wherein the reversing circuit comprises:
an inverter configured to reverse the result of the NAND operation; and
a switch configured to output the reversed result of the NAND operation in response to a precharge signal.

15. The block selection circuit according to claim 13, wherein the pull-up circuit comprises:
a second switch configured to control the amount of a current flowing through the pull-up circuit according to a potential of the reversed result of the NAND operation; and
a third switch configured to form a current path between the second switch and the switching circuits in response to the potential of the result of the NAND operation.

16. The block selection circuit according to claim 12, wherein each of the switching circuits comprises:
a fourth switch configured to receive the block selection voltage and forward the block selection voltage to corresponding one of the pass transistor groups in response to the block selection voltage; and
a fifth switch configured to discharge the block selection voltage received by the fourth switch in response to corresponding one of the selection signals.

17. The block selection circuit according to claim 12, wherein the selection signal generator comprises a plurality of selection signal generating circuits configured to generate selection signals in response to a precharge signal and the lowest addresses.

18. The block selection circuit according to claim 17, wherein each of the selection signal generating circuits comprises:
a NOR gate configured to perform NOR operation to the precharge signal and corresponding one of bits in the lowest addresses; and
a delaying circuit configured to output the result of NOR operation as corresponding one of the selection signals with a predetermined amount of time delay.

19. A semiconductor device, comprising:
a plurality of memory blocks;
a voltage generating circuit configured to output operating voltages to global word lines in response to an operating signal; and
a block selection circuit configured to select one of the memory blocks in response to row addresses selectively couple a plurality of groups of local word lines, each of which corresponds to a memory block to be selected, and the global word lines and for transmitting the operating voltages to one of the groups of local word lines selectively coupled to the global word lines,
wherein the block selection circuit comprises:
a high voltage generating circuit configured to generate a block selection voltage in response to upper addresses included in the row addresses;
a plurality of switching circuits configured to forward the block selection voltage through one of the switching circuits corresponding to the memory block to be selected in response to selection signals that are generated in response to lowest addresses included in the row addresses, wherein the lowest addresses are obtained by decoding the upper addresses; and
pass transistor groups configured to couple the global word lines and one of the groups of local word lines coupled to the memory blocks to be selected, in response to the forwarded block selection voltage.

* * * * *